(12) United States Patent
Liu

(10) Patent No.: US 10,014,483 B2
(45) Date of Patent: Jul. 3, 2018

(54) ORGANIC THIN FILM TRANSISTOR HAVING PATTERNED INTERFACE MODIFICATION LAYER, DISPLAY SUBSTRATE AND DISPLAY APPARATUS HAVING THE SAME, AND FABRICATING METHOD THEREOF

(71) Applicant: BOE TECHNOLOGY GROUP CO., LTD., Beijing (CN)

(72) Inventor: Ze Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/302,955

(22) PCT Filed: Apr. 6, 2016

(86) PCT No.: PCT/CN2016/078555
§ 371 (c)(1),
(2) Date: Oct. 7, 2016

(87) PCT Pub. No.: WO2017/016236
PCT Pub. Date: Feb. 2, 2017

(65) Prior Publication Data
US 2017/0200910 A1 Jul. 13, 2017

(30) Foreign Application Priority Data

Jul. 28, 2015 (CN) .......................... 2015 1 0451019

(51) Int. Cl.
*H01L 29/08* (2006.01)
*H01L 35/24* (2006.01)
(Continued)

(52) U.S. Cl.
CPC ........ *H01L 51/107* (2013.01); *H01L 27/3274* (2013.01); *H01L 51/0014* (2013.01); *H01L 51/055* (2013.01); *H01L 51/105* (2013.01)

(58) Field of Classification Search
CPC  H01L 51/107; H01L 27/3274; H01L 51/0014
(Continued)

(56) References Cited

U.S. PATENT DOCUMENTS 6,433,359 B1  8/2002  Kelley et al.
7,491,286 B2 * 2/2009 Kagan ................... B82Y 10/00
                                                          156/230
(Continued)

FOREIGN PATENT DOCUMENTS

CN      1437272 A    8/2003
CN      1545153 A    11/2004
(Continued)

OTHER PUBLICATIONS

International Search Report & Written Opinion dated Jun. 28, 2016 regarding PCT/CN2016/078555.
(Continued)

*Primary Examiner* — Lex Malsawma
*Assistant Examiner* — Eric W Jones
(74) *Attorney, Agent, or Firm* — Intellectual Valley Law, P.C.

(57) ABSTRACT

The present application discloses a method of fabricating an organic thin film transistor comprising providing a substrate; forming a patterned interface modification layer on the substrate; and forming an organic semiconductor layer on a side of the interface modification layer distal to the substrate, wherein the patterned interface modification layer having a pattern of micro structure.

20 Claims, 9 Drawing Sheets

(51) Int. Cl.
  *H01L 51/00* (2006.01)
  *H01L 51/10* (2006.01)
  *H01L 51/05* (2006.01)
  *H01L 27/32* (2006.01)

(58) Field of Classification Search
  USPC .......................... 257/40, 59; 438/52, 82, 99
  See application file for complete search history.

(56) References Cited

U.S. PATENT DOCUMENTS

| | | | |
|---|---|---|---|
| 2002/0114123 A1 | 8/2002 | Nishio et al. | |
| 2005/0269570 A1 | 12/2005 | Chabinyc et al. | |
| 2007/0293921 A1 | 12/2007 | Noda et al. | |
| 2008/0047930 A1* | 2/2008 | Blanchet | B82Y 10/00 216/41 |
| 2009/0256144 A1* | 10/2009 | Kano | H01L 51/0012 257/40 |
| 2011/0090289 A1* | 4/2011 | Mizukami | B41J 2/161 347/68 |
| 2011/0244639 A1 | 10/2011 | Ogawa et al. | |
| 2012/0104377 A1 | 5/2012 | Kim et al. | |
| 2012/0211740 A1* | 8/2012 | Muller | H01L 51/0545 257/40 |
| 2013/0099215 A1* | 4/2013 | Kushida | H01L 51/0004 257/40 |
| 2013/0168662 A1* | 7/2013 | Kugler | H01L 51/0541 257/40 |
| 2013/0292650 A1* | 11/2013 | Jung | H01L 51/0004 257/40 |
| 2017/0141332 A1* | 5/2017 | Burroughes | H01L 51/0562 |

FOREIGN PATENT DOCUMENTS

| | | |
|---|---|---|
| CN | 1700488 A | 11/2005 |
| CN | 1707811 A | 12/2005 |
| CN | 1719636 A | 1/2006 |
| CN | 1733664 A | 2/2006 |
| CN | 1825652 A | 8/2006 |
| CN | 100999388 A | 7/2007 |
| CN | 101055918 A | 10/2007 |
| CN | 101188272 A | 5/2008 |
| CN | 101212020 A | 7/2008 |
| CN | 101257092 A | 9/2008 |
| CN | 101267020 A | 9/2008 |
| CN | 101267021 A | 9/2008 |
| CN | 101308904 A | 11/2008 |
| CN | 101262041 B | 2/2011 |
| CN | 101969042 A | 2/2011 |
| CN | 101983439 A | 3/2011 |
| CN | 102084485 A | 6/2011 |
| CN | 102103103 A | 6/2011 |
| CN | 102332534 A | 1/2012 |
| CN | 102544368 A | 7/2012 |
| CN | 102623639 A | 8/2012 |
| CN | 102931350 A | 2/2013 |
| CN | 102610756 B | 7/2014 |
| CN | 104218151 A | 12/2014 |
| JP | 2009152355 A | 7/2009 |
| TW | 200807778 A | 2/2008 |

OTHER PUBLICATIONS

First Office Action in the Chinese Patent Application No. 201510451019.2, dated Aug. 3, 2017; English translation attached.

* cited by examiner

ORGANIC THIN FILM TRANSISTOR HAVING PATTERNED INTERFACE MODIFICATION LAYER, DISPLAY SUBSTRATE AND DISPLAY APPARATUS HAVING THE SAME, AND FABRICATING METHOD THEREOF

CROSS-REFERENCE TO RELATED APPLICATION

This application is a national stage application under 35 U.S.C. § 371 of International Application No. PCT/CN2016/078555, filed Apr. 6, 2016, which claims priority to Chinese Patent Application No. 201510451019.2, filed Jul. 28, 2015, the contents of which are incorporated by reference in the entirety.

TECHNICAL FIELD

The present invention relates to thin film transistor technology, more particularly, to an organic thin film transistor, a display substrate and a display apparatus having the same, and a fabricating method thereof.

BACKGROUND

The organic thin film transistors (OTFT) are suitable for making flexible display panels and large area integrated display devices. As compared to conventional thin film transistors, they can be fabricated at a relatively lower temperature range and a lower manufacturing cost. The organic thin film transistors have found a wide range of applications in display field.

The organic thin film transistors typically includes a gate electrode, a gate insulating layer, a source electrode and a drain electrode spaced apart, and an organic semiconductor layer. Some organic thin film transistors also include an interface modification layer to improve the quality of the interface between the organic semiconductor and another layer in contact with the organic semiconductor layer (e.g., a gate insulating layer, a source electrode, or a drain electrode). For example, the electronic properties of a bottom contact-type organic thin film transistor can be enhanced by including an interface modification layer on the source and drain electrodes and a region of the gate insulating layer between the source electrode and the drain electrode.

SUMMARY

In one aspect, the present disclosure provides a method of fabricating an organic thin film transistor, comprising providing a substrate; forming a patterned interface modification layer on the substrate; and forming an organic semiconductor layer on a side of the interface modification layer distal to the substrate.

Optionally, the patterned interface modification layer having a pattern of micro structure.

Optionally, the step of forming the patterned interface modification layer comprises forming a first patterned interface modification layer having a first pattern of micro structure on a side of a gate insulating layer distal to a gate electrode in a first contact region, the first contact region being a gate insulating layer region between a source electrode and a drain electrode in plan view of the substrate.

Optionally, the step of forming the patterned interface modification comprises forming a second patterned interface modification layer having a second pattern of micro structure on a side of the source electrode and the drain electrode distal to the gate insulating layer in a second contact region, the second contact region being a region corresponding to the source electrode and the drain electrode.

Optionally, the step of forming the patterned interface modification comprises forming a first patterned interface modification layer having a first pattern of micro structure on a side of a gate insulating layer distal to a gate electrode in a first contact region, the first contact region being a gate insulating layer region between a source electrode and a drain electrode in plan view of the substrate; and forming a second patterned interface modification layer having a second pattern of micro structure on a side of the source electrode and the drain electrode distal to the gate insulating layer in a second contact region, the second contact region being a region corresponding to the source electrode and the drain electrode.

Optionally, the step of forming the first patterned interface modification layer comprises forming a first interface modification material layer by applying a solution containing a first interface modification material to a surface of the substrate; washing the substrate with ethanol; and drying the substrate; forming the first pattern of micro structure in the first contact region on the first interface modification material layer by exposing the first interface modification material layer to an ultraviolet light with a first mask plate; and removing the first interface modification material in exposed areas by ultraviolet radiation; and exposing the first interface modification material layer to an ultraviolet light in regions other than the first contact region, and removing the first interface modification material by ultraviolet radiation in the regions other than the first contact region.

Optionally, the step of forming the second patterned interface modification layer comprises forming a second interface modification material layer by applying a solution containing a second interface modification material to a surface of the substrate; washing the substrate with ethanol; and drying the substrate; forming the second pattern of micro structure in the second contact region on the second interface modification material layer by exposing the second interface modification material layer to an ultraviolet light with a second mask plate; and removing the second interface modification material in exposed areas by ultraviolet radiation; and exposing the second interface modification material layer to an ultraviolet light in regions other than the second contact region, and removing the second interface modification material by ultraviolet radiation in the regions other than the second contact region.

Optionally, the first pattern of micro structure is formed using a first mask plate; and the second pattern of micro structure is formed using a second mask plate different from the first mask plate.

Optionally, the first pattern of micro structure and the second pattern of micro structure are formed using a third mask plate in a single process.

Optionally, the substrate comprises a base substrate; a gate electrode on the base substrate; a gate insulating layer on a side of the gate electrode distal to the base substrate; and a source electrode and a drain electrode on a side of the gate insulating layer distal to the gate electrode.

Optionally, the substrate comprises a base substrate; a gate electrode on the base substrate; and a gate insulating layer on a side of the gate electrode distal to the base substrate; the step of forming the patterned interface modification layer comprises forming a patterned interface modification layer on a side of gate insulating layer distal to the gate electrode; the step of forming the organic semiconductor layer comprises forming the organic semiconductor layer on a side of the patterned interface modification layer distal to the gate insulating layer; and subsequent to the step of forming the organic semiconductor layer, the method further comprising forming a source electrode and a drain electrode on a side of the organic semiconductor layer distal to the patterned interface modification layer.

Optionally, the step of forming the patterned interface modification layer comprises applying a solution containing an interface modification material to a surface of the substrate; washing the substrate with ethanol; drying the substrate, thereby forming an interface modification material layer; and exposing the interface modification material layer to an ultraviolet light with a mask plate; removing interface modification material in exposed areas by ultraviolet radiation thereby forming the patterned interface modification layer.

Optionally, the step of forming the patterned interface modification layer comprises forming an interface modification material layer on the substrate; exposing the interface modification material layer to an ultraviolet light in the presence of ozone with a mask plate.

In another aspect, the present disclosure provides an organic thin film transistor, comprising a base substrate, an organic semiconductor layer, and a patterned interface modification layer on a side of the organic semiconductor layer proximal to the base substrate.

Optionally, the patterned interface modification layer having a pattern of micro structure.

Optionally, the organic thin film transistor further comprises a gate electrode on the base substrate, a gate insulating layer on a side of the gate electrode distal to the base substrate, and a source electrode and a drain electrode on a side of the gate insulating layer distal to the gate electrode; the patterned interface modification layer comprises one or both of a first patterned interface modification layer on a side of gate insulating layer distal to the gate electrode in a first contact region, the first contact region being a gate insulating layer region between the source electrode and the drain electrode in plan view of the substrate, and a second patterned interface modification layer on a side of the source electrode and the drain electrode distal to the gate insulating layer in a second contact region, the second contact region being a region corresponding to the source electrode and the drain electrode.

Optionally, the patterned interface modification layer having a pattern of micro structure comprising an array of interface modification blocks and/or rods.

Optionally, the blocks or the rods has a length and a width in the range of about 0.1 μm to about 1 μm.

Optionally, the patterned interface modification layer is made of a photosensitive organic molecule.

Optionally, the organic thin film transistor further comprises a base substrate; a gate electrode on the base substrate; a gate insulating layer on a side of the gate electrode distal to the base substrate; and the source electrode and the drain electrode on a side of the organic semiconductor layer distal to the patterned interface modification layer; wherein the patterned interface modification layer is on a side of the gate insulating layer distal to the gate electrode; and the organic semiconductor layer on a side of the patterned interface modification layer distal to the gate insulating layer.

In another aspect, the present disclosure provides a display substrate comprising an organic thin film transistor described herein or manufactured by a method described herein.

In another aspect, the present disclosure provides a display apparatus comprising a display substrate described herein.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
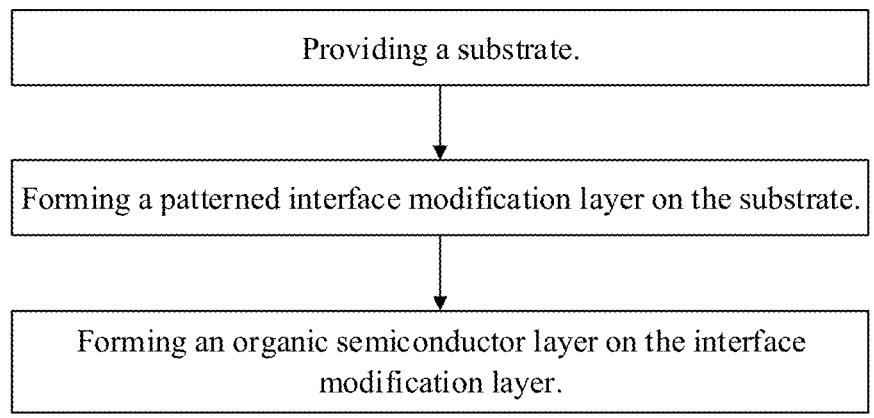
FIG. 1 is a flow chart illustrating a method of fabricating an organic thin film transistor in some embodiments.

The disclosure will now describe more specifically with reference to the following embodiments. It is to be noted that the following descriptions of some embodiments are presented herein for purpose of illustration and description only. It is not intended to be exhaustive or to be limited to the precise form disclosed.

In some convention organic thin film transistors, an interface modification layer is included between the organic semiconductor layer and one or more organic thin film transistor layer(s). Typically, in a conventional organic thin film transistor, the interface modification layer is entirely formed on the one or more organic thin film transistor layer(s), followed by forming the organic semiconductor layer on the interface modification layer. The conventional organic thin film transistors have several disadvantages. For example, the organic semiconductor solution exhibits high-contact angle dewetting behavior when applied on the interface modification layer, due to the nature of the material useful for making the interface modification layer. The high-contact angle dewetting behavior results in uneven distribution of the organic semiconductor material and a non-uniform organic semiconductor layer.

The present disclosure provides a superior organic thin film transistor that overcomes the disadvantage of the conventional organic thin film transistor, and a method of fabricating the organic thin film transistor. In one aspect, the present disclosure provides a method of fabricating an organic thin film transistor. In some embodiments, the method includes forming a patterned interface modification layer on the substrate. In another aspect, the present disclosure provides a superior organic thin film transistor. In some embodiments, the organic thin film transistor includes a patterned interface modification layer adjacent to at least a portion of the organic semiconductor layer.

In some embodiments, the present method includes providing a substrate; forming a patterned interface modification layer on the substrate; and forming an organic semiconductor layer on a side of the interface modification layer distal to the substrate. Optionally, the patterned interface modification layer has a pattern of micro structure. Optionally, the step of forming the patterned interface modification layer includes one or both of forming a first patterned interface modification layer on a side of a gate insulating layer distal to a gate electrode in a first contact region, the first contact region being a gate insulating layer region between a source electrode and a drain electrode in plan view of the substrate, the first patterned interface modification layer comprises a first pattern of micro structure in each first contact region; and forming a second patterned interface modification layer on a side of the source electrode and the drain electrode distal to the gate insulating layer in a second contact region, the second contact region being a region corresponding to the source electrode and the drain electrode, the second patterned interface modification layer comprises a second pattern of micro structure on a side of the source electrode distal to the gate insulating layer and on a side of the drain electrode distal to the gate insulating layer in each second contact region. Optionally, the first pattern of micro structure and the second pattern of micro structure are different patterns. Optionally, the first pattern of micro structure and the second pattern of micro structure are substantially the same. By having the pattern of micro structure in the contact regions, the modification area is reduced, leading to a small contact angle.

As used herein, the term "pattern" or "patterned" refers to lithographic processes such as masking and etching processes. In some organic thin film transistors, the organic semiconductor layer is in contact with one or more contacting layer(s) (e.g., source and drain electrodes or a gate insulating layer) in one or more contact region(s). In some organic thin film transistors, the interface modification layer in each contact region on an individual contacting layer is patterned, i.e., the interface modification layer in the contact region on that individual contacting layer is not a substantially uniform layer. By having a pattern in each contact region on an individual contacting layer in each thin film transistor, the present interface modification layer reduces the contact angle between the organic semiconductor layer and that individual layer (e.g., source and drain electrodes or a gate insulating layer). Any appropriate pattern for reducing contact angle may be practiced. For example, the pattern may be an array of micro structures of a certain shape and dimension.

Optionally, the present patterned interface modification layer exhibits a contact angle of less than about 80°, less than about 70°, less than about 60°, less than about 50°, less than about 40°, less than about 30°, less than about 20°, less than about 10°, or less than about 5°.

FIG. 1 is a flow chart illustrating a method of fabricating an organic thin film transistor in some embodiments. Referring to FIG. 1, the method in the embodiment includes providing a substrate; forming a patterned interface modification layer on the substrate; and forming an organic semiconductor layer on the interface modification layer. Optionally, the patterned interface modification layer has a pattern of micro structure. Optionally, the substrate is a substrate having a base substrate, a gate electrode on the base substrate, a gate insulating layer on a side of the gate electrode distal to the base substrate, and source and drain electrodes on a side of the gate insulating layer distal to the gate electrode. Optionally, the substrate is a substrate having a base substrate, a gate electrode on the base substrate, and a gate insulating layer on a side of the gate electrode distal to the base substrate (e.g., a substrate prior to source/drain electrode formation).

Figure 13A:
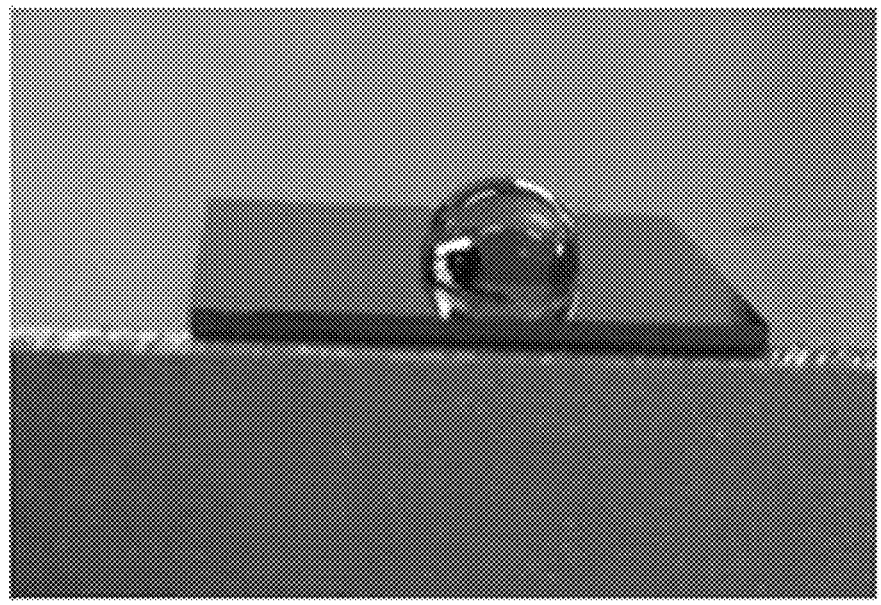
FIGS. 13A and 13B compare the contact angles formed between an organic semiconductor solution and a substrate having an un-patterned interface modification layer, and between the organic semiconductor solution and a substrate having a patterned interface modification layer according to the present disclosure.
Figure 13B:
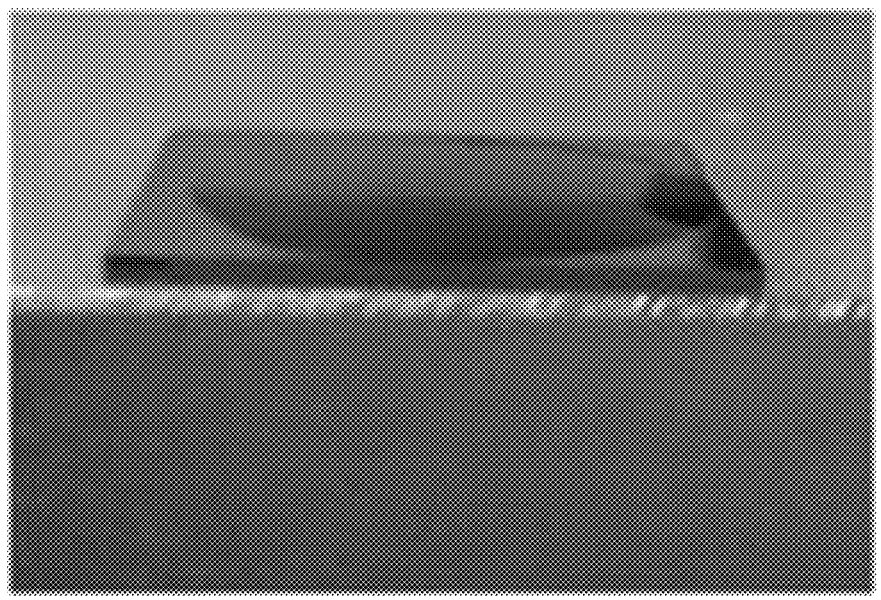

In the present method, a patterned interface modification layer is formed on a substrate prior to forming the organic semiconductor layer. By forming a patterned interface modification layer in a contact region on an individual contacting layer, the substrate surface is modified to have a significantly smaller contact angle as compared to a substrate having an un-patterned interface modification layer (see FIG. 13), effectively preventing the uneven distribution of the organic semiconductor solution on the individual layer when the solution is applied to the substrate.

In some embodiments, prior to forming a patterned interface modification layer, the substrate is a substrate having a base substrate, a gate electrode on the base substrate, a gate insulating layer on a side of the gate electrode distal to the base substrate, and source and drain electrodes on a side of the gate insulating layer distal to the gate electrode. Optionally, the method includes forming a gate electrode on a base substrate, forming a gate insulating layer on a side of the gate electrode distal to the base substrate, and forming source and drain electrodes on a side of the gate insulating layer distal to the gate electrode.

In some embodiments, the organic thin film transistor includes at least two individual contacting layers that are in contact with the organic semiconductor layer, i.e., the substrate includes at least two contacting layers, each of which has a contact region with the organic semiconductor layer. Optionally, the first contacting layer is the gate insulating layer, and the second contacting layer is the source and drain electrodes layer having a source electrode and a drain electrode. Optionally, the first contact region is a gate insulating layer region between the source electrode and the drain electrode in plan view of the substrate, and the second contact region is the source and drain electrodes region.

In some embodiments, the method includes forming a patterned interface modification layer on at least one contacting layer, e.g., the first contacting layer or the second contacting layer or both. For example, the method may include forming a patterned interface modification layer in at least one contact region, e.g., the first contact region or the second contact region or both. Optionally, the method further includes forming an organic semiconductor layer on a side of the patterned interface modification layer distal to the at least one contacting layer. Optionally, the method includes forming an organic semiconductor layer on a side of the patterned interface modification layer distal to the first contacting layer, and forming the organic semiconductor layer on a side of the second contacting layer distal to the base substrate.

In some embodiments, the method includes forming a gate electrode on a base substrate, forming a gate insulating layer on a side of the gate electrode distal to the base substrate, and forming a patterned interface modification layer on a side of the gate insulating layer distal to the gate electrode; and forming an organic semiconductor layer on a side of the patterned interface modification layer distal to the gate insulating layer. Optionally, the method further includes forming source and drain electrodes on a side of the gate insulating layer distal to the gate electrode.

In some embodiments, the method includes forming a first patterned interface modification layer on the gate insulating layer in a first contact region, the first contact region being a gate insulating layer region between the source electrode and the drain electrode in plan view of the substrate. Specifically, the method includes forming a first interface modification material layer on the gate insulating layer in the first contact region; exposing (e.g., to ultraviolet radiation) the first interface modification material layer with a first mask plate; forming a first pattern on the first interface modification material layer in the first contact region, thereby forming a first patterned interface modification layer on the gate insulating layer.

In some embodiments, the method includes forming a second patterned interface modification layer on the source and drain electrodes. Specifically, the method includes forming a second interface modification material layer on the source and drain electrodes; exposing (e.g., to ultraviolet radiation) the second interface modification material layer with a second mask plate; forming a second pattern on the second interface modification material layer in a region corresponding to the source and drain electrodes, thereby forming a second patterned interface modification layer on the source and drain electrodes.

In some embodiments, the method includes forming a patterned interface modification layer on the source and drain electrodes and in the first contact region on the gate insulating layer. Specifically, the method includes forming a first interface modification material layer in a first contact region on the gate insulating layer, the first contact region being a gate insulating layer region between the source electrode and the drain electrode in plan view of the substrate; forming a second interface modification material layer on the source and drain electrodes; exposing (e.g., to ultraviolet radiation) the first interface modification material layer with a first mask plate; exposing (e.g., to ultraviolet radiation) the second interface modification material layer with a second mask plate; forming a first pattern on the first interface modification material layer in the first contact region; forming a second pattern on the second interface modification material layer in a region corresponding to the source and drain electrodes, thereby forming a first patterned interface modification layer on the gate insulating layer and a second patterned interface modification layer on the source and drain electrodes.

In some embodiments, the method includes forming a patterned interface modification layer on the source and drain electrodes and in the first contact region on the gate insulating layer. Specifically, the method includes forming an interface modification material layer on the substrate, the interface modification material layer comprises a first interface modification material layer in a first contact region on the gate insulating layer and a second interface modification material layer on the source and drain electrodes, the first contact region being a gate insulating layer region between the source electrode and the drain electrode in plan view of the substrate. The first interface modification material layer and the second first interface modification material layer may be made of a same material and formed in a single process. The method may further include exposing (e.g., to ultraviolet radiation) the interface modification material layer with a third mask plate; forming a first pattern on the first interface modification material layer in the first contact region and a second pattern on the second interface modification material layer in a region corresponding to the source and drain electrodes, thereby forming a first patterned interface modification layer on the gate insulating layer and a second patterned interface modification layer on the source and drain electrodes.

In some embodiments, the step of forming the first patterned interface modification layer includes soaking the substrate in (or spinning coating the substrate with) a solution containing an interface modification material (e.g., octadecyltrichlorosilane (OTS) or 1,1,1,3,3,3-hexamethyldisilazane (HMDS)) for a soaking duration; washing the substrate with ethanol; drying the substrate thereby forming a first interface modification material layer. The step may further include exposing the first interface modification material layer to an ultraviolet light with a first mask plate; removing the first interface modification material by ultraviolet radiation in a first exposed area; forming a first pattern on the first interface modification material layer in a first contact region, the first contact region being a gate insulating layer region between the source electrode and the drain electrode in plan view of the substrate; thereby forming the first patterned interface modification layer on the gate insulating layer. Optionally, the step further includes exposing the first interface modification material layer to an ultraviolet light in regions other than the first contact region, removing the first interface modification material by ultraviolet radiation in the regions other than the first contact region. For example, the first interface modification material layer on the source and drain electrodes may be removed by ultraviolet radiation.

In some embodiments, the step of forming the second patterned interface modification layer includes soaking the substrate in (or spinning coating the substrate with) a solution containing an interface modification material (e.g., OTS or HMDS) for a soaking duration; washing the substrate with ethanol; drying the substrate thereby forming a second interface modification material layer. The step may further include exposing the second interface modification material layer to an ultraviolet light with a second mask plate, removing the second interface modification material by ultraviolet radiation in a second exposed area; forming a second pattern on the second interface modification material layer in a region corresponding to the source and drain electrodes; thereby forming the second patterned interface modification layer on the source and drain electrodes. Optionally, the step further includes exposing the second interface modification material layer to an ultraviolet light in regions other than the region corresponding to the source and drain electrodes, removing the second interface modification material by ultraviolet radiation in the regions other than the region corresponding to the source and drain electrodes. For example, the second interface modification material layer on the gate insulating layer may be removed by ultraviolet radiation.

In some embodiments, the step of forming a patterned interface modification layer on the source and drain electrodes and in the first contact region on the gate insulating layer includes soaking the substrate in (or spinning coating the substrate with) a solution containing an interface modification material (e.g., OTS or HMDS) for a soaking duration; washing the substrate with ethanol; drying the substrate thereby forming an interface modification material layer.

The interface modification material layer includes a first interface modification material layer in a first contact region on the gate insulating layer and a second interface modification material layer on the source and drain electrodes; the first contact region being a gate insulating layer region between the source electrode and the drain electrode in plan view of the substrate. The first interface modification material layer and the second first interface modification material layer may be made of a same material and formed in a single process. The step may further include exposing the first interface modification material layer to an ultraviolet light with a first mask plate; removing the first interface modification material by ultraviolet radiation in a first exposed area; forming a first pattern on the first interface modification material layer in the first contact region; exposing the second interface modification material layer to an ultraviolet light with a second mask plate, removing the second interface modification material by ultraviolet radiation in a second exposed area; forming a second pattern on the second interface modification material layer in a region corresponding to the source and drain electrodes; thereby forming the first patterned interface modification layer on the gate insulating layer and the second patterned interface modification layer on the source and drain electrodes.

In some embodiments, the step of forming a patterned interface modification layer on the source and drain electrodes and in the first contact region on the gate insulating layer includes soaking the substrate in (or spinning coating the substrate with) a solution containing an interface modification material (e.g., OTS or HMDS) for a soaking duration; washing the substrate with ethanol; drying the substrate thereby forming an interface modification material layer. The interface modification material layer includes a first interface modification material layer in a first contact region on the gate insulating layer and a second interface modification material layer on the source and drain electrodes; the first contact region being a gate insulating layer region between the source electrode and the drain electrode in plan view of the substrate. The first interface modification material layer and the second first interface modification material layer may be made of a same material and formed in a single process. The step may further include exposing the interface modification material layer to an ultraviolet light with a single mask plate (e.g., a third mask plate); removing the interface modification material by ultraviolet radiation in an exposed area; forming one or more pattern on the interface modification material layer in a first contact region and a region corresponding to the source and drain electrodes, the first contact region being a gate insulating layer region between the source electrode and the drain electrode in plan view of the substrate; thereby forming a patterned interface modification layer on the gate insulating layer and the source and drain electrodes.

In some embodiments, the step of forming a patterned interface modification layer includes forming a patterned interface modification layer on the gate insulating layer. Specifically, the method includes soaking the substrate in (or spinning coating the substrate with) a solution containing an interface modification material (e.g., OTS or HMDS) for a soaking duration; washing the substrate with ethanol; drying the substrate thereby forming an interface modification material layer. The step may further include exposing the interface modification material layer to an ultraviolet light with a fourth mask plate; removing the interface modification material by ultraviolet radiation in an exposed area; forming a pattern on the interface modification material layer on the gate insulating layer; thereby forming a patterned interface modification layer on the gate insulating layer.

Optionally, the exposing step is performed in the presence of ozone. For example, an ozone-containing gas may be supplied into the UV exposure chamber during the exposing step.

Figure 2:
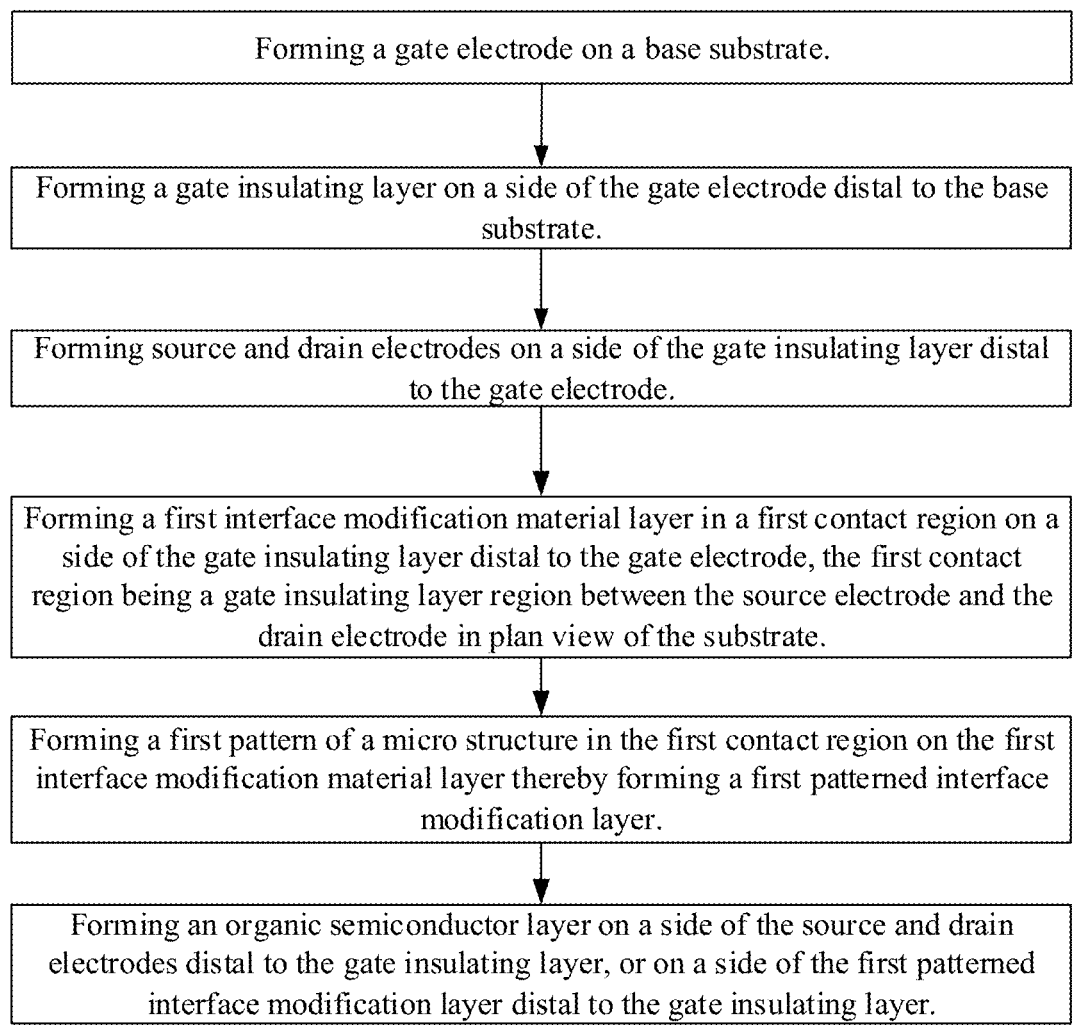
FIG. 2 is a flow chart illustrating a method of fabricating an organic thin film transistor in some embodiments.

FIG. 2 is a flow chart illustrating a method of fabricating an organic thin film transistor in some embodiments. Referring to FIG. 2, the method in the embodiment includes forming a gate electrode on a base substrate; forming a gate insulating layer on a side of the gate electrode distal to the base substrate; forming source and drain electrodes on a side of the gate insulating layer distal to the gate electrode; forming a first interface modification material layer in a first contact region on a side of the gate insulating layer distal to the gate electrode, the first contact region being a gate insulating layer region between the source electrode and the drain electrode in plan view of the substrate; forming a first pattern of micro structure in the first contact region on the first interface modification material layer thereby forming a first patterned interface modification layer; and forming an organic semiconductor layer on a side of the source and drain electrodes distal to the gate insulating layer, or on a side of the first patterned interface modification layer distal to the gate insulating layer.

The base substrate may be made of any appropriate material such as a glass or quartz or any appropriate thickness. Optionally, the thin film transistor is a bottom contact-type thin film transistor, and includes a gate electrode on the base substrate. Optionally, the thin film transistor is a top contact-type thin film transistor.

The gate electrode may be formed using any appropriate method, e.g., by vapor deposition or sputtering. The gate electrode may be patterned by, e.g., exposure, developing and etching processes.

Optionally, the gate electrode is made of an aluminum-containing material. Optionally, the aluminum-containing material is deposited on the substrate by vapor deposition; a positive photoresist layer is formed on the deposited aluminum layer. The positive photoresist layer is exposed to an ultraviolet light having a wavelength of 365 nm using a mask plate, and developed using 2.38% tetra-methyl ammonium hydroxide (TMAH) solution, thereby exposing a portion of the aluminum layer. The aluminum layer is etched by an aluminum etchant thereby forming the gate electrode layer.

The gate insulating layer may be made of any appropriate material and formed by any appropriate methods, e.g., by chemical vapor deposition (CVD), sputtering, or coating. Optionally, the gate insulating layer is made of silicon oxide ($SiO_x$). Optionally, the gate insulating layer is formed by plasma enhanced chemical vapor deposition (PECVD) using a gas containing $SiH_4$ and $N_2O$.

The source and drain electrodes may be formed by any appropriate methods, e.g., by vapor deposition or sputtering. Optionally, source and drain electrodes material may be deposited on the substrate. A photoresist layer is coated on the deposited source and drain electrode material layer, followed by UV exposure, development, baking and etching, thereby forming the source and drain electrodes.

Optionally, the source and drain electrodes are formed using a lift-off method using a photoresist layer, e.g., a negative photoresist layer. Specifically, a negative photoresist is formed on the gate insulating layer, followed by exposure under a mask plate. The negative photoresist in areas corresponding to the source electrode and the drain electrode is exposed and developed. The exposed negative photoresist in areas corresponding to the source electrode and the drain electrode is removed, and the negative photoresist in the remaining areas (e.g., the area between the source electrode and the gate electrode) remains. A source and drain electrode material is then deposited on the photoresist layer. Subsequently, the substrate is subject to lift-off in a solvent, e.g., N-methylpyrrolidone (NMP) at a temperature (e.g., around 60 degree celsius). The substrate is then washed using ethanol and dried. The negative photoresist and the deposited electrode material in the remaining area (e.g., the area between the source electrode and the gate electrode) are removed. Optionally, prior to the life-off, a patterned interface modification layer may be formed on the source and drain electrode material layer, followed by lift-off in the solvent. The negative photoresist, the deposited electrode material, and the patterned interface modification layer in the remaining area (e.g., the area between the source electrode and the gate electrode) are removed.

Optionally, the source/drain electrodes are formed using an etching method using a photoresist layer, e.g., a positive photoresist layer. Specifically, source and drain electrodes material is then deposited on the gate insulating layer. A photoresist layer is coated on the deposited source and drain electrode material layer, a mask having the source and drain electrodes pattern is placed on the photoresist layer, followed by UV exposure (e.g., 365 nm UV), development (e.g., using a 2.38% TMAH solution), baking and etching, thereby forming the source and drain electrodes. Optionally, the remaining photoresist layer is removed using NMP solvent. The substrate is then washed using an alkali solution and water, baked at 80 degree celsius or air-dried.

Accordingly, the first patterned interface modification layer is then formed on a substrate having the gate electrode, the gate insulating layer, and the source and drain electrodes. Optionally, the step of forming the first patterned interface modification layer includes forming a first interface modification material layer on the gate insulating layer in a first contact region, the first contact region being a gate insulating layer region between the source electrode and the drain electrode in plan view of the substrate; and forming a first pattern in the first contact region on the first interface modification material layer thereby forming a first patterned interface modification layer. Optionally, the step further includes exposing the first interface modification material layer to an ultraviolet light in regions other than the first contact region, removing the first interface modification material by ultraviolet radiation in the regions other than the first contact region. For example, the first interface modification material layer on the source and drain electrodes may be removed by ultraviolet radiation.

The first interface modification material layer may be coated on the substrate by any appropriate method. Optionally, the first interface modification material layer is formed by soaking the substrate in (or spinning coating the substrate with) a solution containing an interface modification material (e.g., OTS or HMDS) for a soaking duration; washing the substrate with ethanol; and drying the substrate thereby forming a first interface modification material layer.

Optionally, the OTS solution is a solution having 1 mM OTS in ethanol. Optionally, the HMDS solution is a solution having 1 mM HMDS in propylene glycol monomethyl ether acetate (PGMEA). The soaking may be performed for a duration of about 1 hour, following by ethanol wash, and baking at 100 degree celsius for 10 minute.

Optionally, the step further includes exposing the first interface modification material layer to an ultraviolet light in regions other than the first contact region, removing the first interface modification material by ultraviolet radiation in the regions other than the first contact region. For example, the first interface modification material layer on the source and drain electrodes may be removed by ultraviolet radiation.

Optionally, the first interface modification material is a photosensitive material. Optionally, the first interface modification material is a material that can be decomposed by ultraviolet radiation. For example, the first interface modification material exposed to ultraviolet radiation is removed from the substrate, and the unexposed first interface modification material remains.

Figure 3:
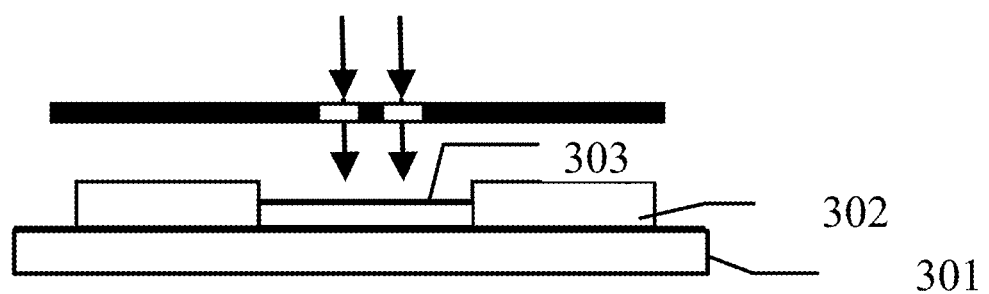
FIG. 3 is a diagram illustrating a process of patterning the first interface modification layer using a first mask plate in some embodiments.

Numerous embodiments may be practiced for forming the first pattern in the first interface modification material layer. For example, the first pattern may be formed by using a first mask plate, thereby forming a first patterned interface modification layer with the first contact region. The first mask plate includes a pattern corresponding to the first pattern. FIG. 3 is a diagram illustrating a process of patterning the first interface modification layer using a first mask plate in some embodiments. Referring to FIG. 3, the organic thin film transistor in the embodiment includes a gate insulating layer 301, source and drain electrodes 302, and a first patterned interface modification layer 303 in the first contact region.

Any appropriate exposure device may be used. Examples of exposure devices include, but are not limited to, a contact exposure device, a projection exposure device, and a stepper exposure device. Optionally, the exposing step is performed in the presence of ozone. For example, an ozone-containing gas may be supplied into the UV exposure device during the exposing step.

Having ozone during the UV exposure process promotes a homogenous degradation of the first interface modification material layer. It also has surface cleansing and surface oxidation functions.

As discussed above, the method in the embodiment includes exposing the first interface modification material layer to an ultraviolet light with a first mask plate and forming a first pattern on the first interface modification material layer in a first contact region. Optionally, the method further includes exposing the first interface modification material layer to an ultraviolet light in regions other than the first contact region and removing the first interface modification material by ultraviolet radiation in the regions other than the first contact region. Optionally, these two exposing steps are performed separately using two mask plates. Optionally, the two exposing steps are performed in one single exposure step using one single mask plate.

The method in FIG. 2 includes a step of forming an organic semiconductor layer on a side of the source and drain electrodes distal to the gate insulating layer, or on a side of the first patterned interface modification layer distal to the gate insulating layer. For example, the organic thin film transistor in some embodiments does not include an interface modification layer between the organic semiconductor layer and the source and drain electrodes. The interface modification layer is limited to the first contact region on the gate insulating layer.

Optionally, the organic semiconductor layer may be formed by coating an organic semiconductor material on the first patterned interface modification layer and on the source and drain electrodes.

Figure 4:
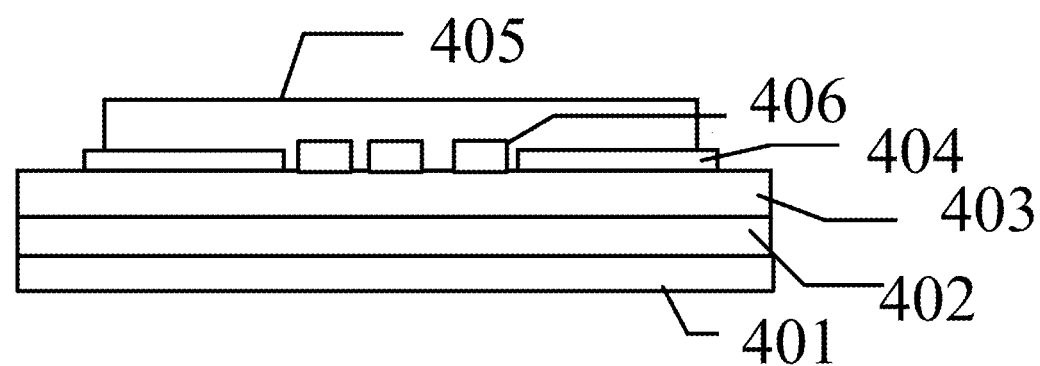
FIG. 4 is a diagram illustrating the structure of an organic thin film transistor in some embodiments.

FIG. 4 is a diagram illustrating the structure of an organic thin film transistor in some embodiments. Referring to FIG. 4, the organic thin film transistor is an organic thin film transistor fabricated by the method illustrated in FIG. 2. The organic thin film transistor in FIG. 2 is a bottom contact-type organic thin film transistor. Optionally, the organic thin film transistor may be a top contact-type organic thin film transistor in some embodiments.

In the present method, a first patterned interface modification layer is formed in the first contact region on the gate insulating layer. By forming a first patterned interface modification layer in the first contact region on the gate insulating layer, the substrate surface is modified to have a significantly smaller contact angle as compared to a substrate having an un-patterned interface modification layer (see FIG. 13), effectively preventing the uneven distribution of the organic semiconductor solution on the individual layer when the solution is applied to the substrate.

Figure 5:
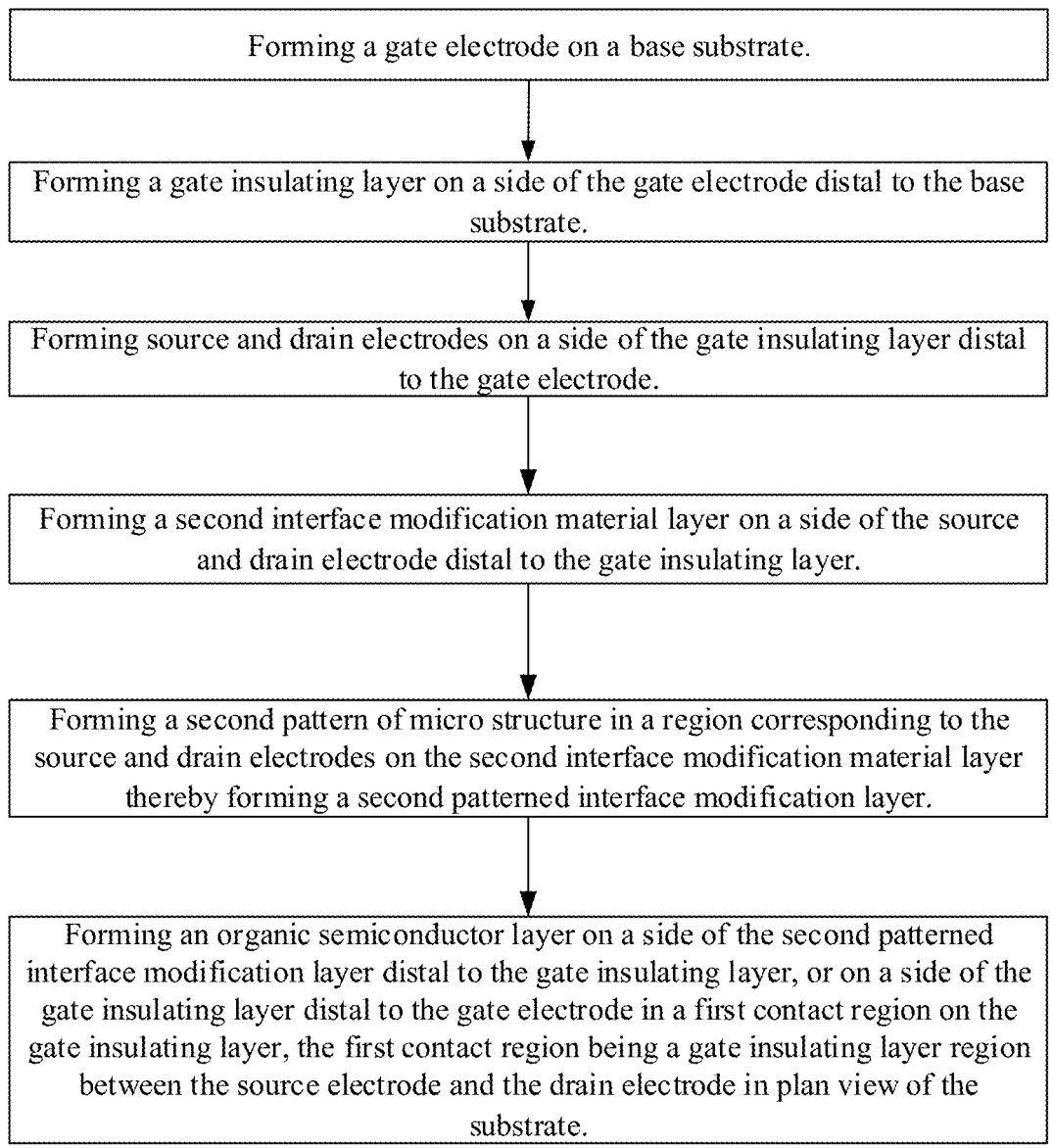
FIG. 5 is a flow chart illustrating a method of fabricating an organic thin film transistor in some embodiments.

FIG. 5 is a flow chart illustrating a method of fabricating an organic thin film transistor in some embodiments. Referring to FIG. 5, the method in the embodiment includes forming a gate electrode on a base substrate; forming a gate insulating layer on a side of the gate electrode distal to the base substrate; forming source and drain electrodes on a side of the gate insulating layer distal to the gate electrode; forming a second interface modification material layer on a side of the source and drain electrodes distal to the gate insulating layer; forming a second pattern of micro structure in a region corresponding to the source and drain electrodes on the second interface modification material layer thereby forming a second patterned interface modification layer; and forming an organic semiconductor layer on a side of the second patterned interface modification layer distal to the gate insulating layer, or on a side of the gate insulating layer distal to the gate electrode in a first contact region on the gate insulating layer, the first contact region being a gate insulating layer region between the source electrode and the drain electrode in plan view of the substrate.

With reference to the first three steps of the method illustrated in FIG. 5, the same basic processes and conditions as discussed in connection with the corresponding steps of FIG. 2 can be used. Various embodiments discussed therein may be practiced in connection with the first three steps of the method illustrated in FIG. 5 in an equivalent fashion.

Accordingly, the second patterned interface modification layer is then formed on a substrate having the gate electrode, the gate insulating layer, and the source and drain electrodes. Optionally, the step of forming the second patterned interface modification layer includes forming a second interface modification material layer on a side of the source and drain electrodes distal to the gate insulating layer; and forming a second pattern a region corresponding to the source and drain electrodes thereby forming a second patterned interface modification layer. Optionally, the step further includes exposing the second interface modification material layer to an ultraviolet light in regions other than the region corresponding to the source and drain electrodes, removing the second interface modification material by ultraviolet radiation in the regions other than the region corresponding to the source and drain electrodes. For example, the second interface modification material layer on the gate insulating layer may be removed by ultraviolet radiation.

With reference to the second interface modification material layer and the second patterned interface modification layer, the same basic processes and conditions as discussed in connection with the first interface modification material layer and the first patterned interface modification layer in FIG. 2 can be used. Various embodiments discussed therein may be practiced in connection with the second interface modification material layer and the second patterned interface modification layer in an equivalent fashion.

With reference to removal of the second interface modification material by ultraviolet radiation in the regions other than the region corresponding to the source and drain electrodes, the same basic processes and conditions as discussed in connection with the removal of the first interface modification material in regions other than the first contact region can be used. Various embodiments discussed therein may be practiced in connection with the second interface modification material layer in an equivalent fashion.

Figure 6:
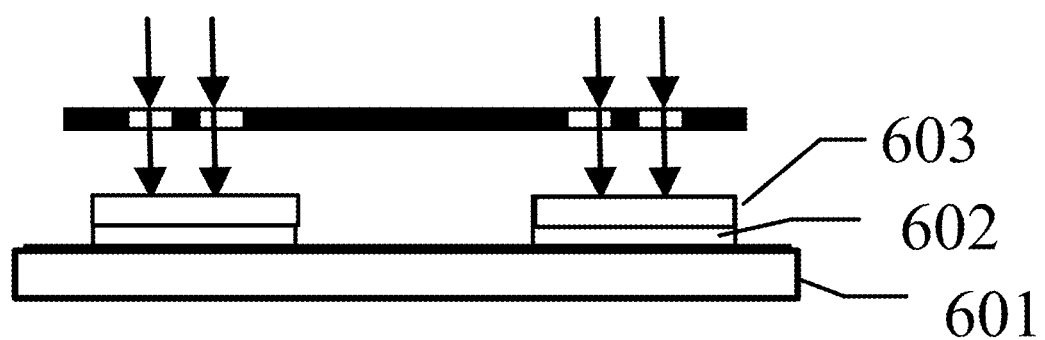
FIG. 6 is a diagram illustrating a process of patterning the first interface modification layer in some embodiments.

Numerous embodiments may be practiced for forming the second pattern in the second interface modification material layer. For example, the second pattern may be formed by using a second mask plate, thereby forming a second patterned interface modification layer with the region corresponding to the source and drain electrodes (i.e., the second contact region). The second mask plate includes a pattern corresponding to the second pattern. FIG. 6 is a diagram illustrating a process of patterning the second interface modification layer using a second mask plate in some embodiments. Referring to FIG. 6, the organic thin film transistor in the embodiment includes a gate insulating layer 601, source and drain electrodes 602, and a second patterned interface modification layer 603 in the region corresponding to the source and drain electrodes 602.

Any appropriate exposure device may be used. Examples of exposure devices include, but are not limited to, a contact exposure device, a projection exposure device, and a stepper exposure device. Optionally, the exposing step is performed in the presence of ozone. For example, an ozone-containing gas may be supplied into the UV exposure device during the exposing step.

Having ozone during the UV exposure process promotes a homogenous degradation of the second interface modification material layer. It also has surface cleansing and surface oxidation functions.

As discussed above, the method in the embodiment includes exposing the second interface modification material layer to an ultraviolet light with a second mask plate and forming a second pattern on the second interface modification material layer in the region corresponding to the source and drain electrodes. Optionally, the method further includes exposing the second interface modification material layer to an ultraviolet light in regions other than the region corresponding to the source and drain electrodes and removing the second interface modification material by ultraviolet radiation in the regions other than the region corresponding to the source and drain electrodes. Optionally, these two exposing steps are performed separately using two mask plates. Optionally, the two exposing steps are performed in one single exposure step using one single mask plate.

The method in FIG. 5 includes a step of forming an organic semiconductor layer on a side of the second patterned interface modification layer distal to the gate insulating layer, or on a side of the gate insulating layer distal to the gate electrode in the first contact region on the gate insulating layer. For example, the organic thin film transistor in some embodiments does not include an interface modification layer in the first contact region. The interface modification layer is limited to the region corresponding to the source and drain electrodes.

Optionally, the organic semiconductor layer may be formed by coating an organic semiconductor material on the second patterned interface modification layer and on the gate insulating layer in the first contact region.

Figure 7:
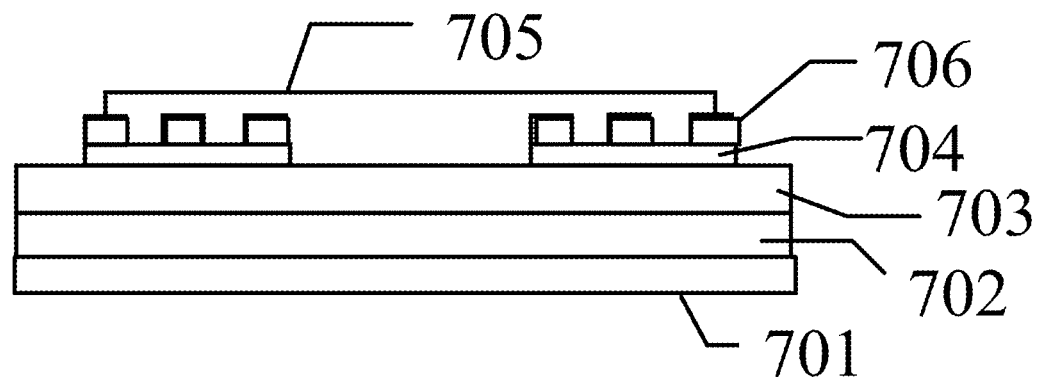
FIG. 7 is a diagram illustrating the structure of an organic thin film transistor in some embodiments.

FIG. 7 is a diagram illustrating the structure of an organic thin film transistor in some embodiments. Referring to FIG.

7, the organic thin film transistor is an organic thin film transistor fabricated by the method illustrated in FIG. 5. The organic thin film transistor in FIG. 7 is a bottom contact-type organic thin film transistor. Optionally, the organic thin film transistor may be a top contact-type organic thin film transistor in some embodiments.

In the present method, a second patterned interface modification layer is formed on a side of the source and drain electrodes distal to the gate insulating layer in a second contact region, the second contact region being a region corresponding to the source electrode and the drain electrode. By forming a second patterned interface modification layer in the second contact region on the source and drain electrodes, the substrate surface is modified to have a significantly smaller contact angle as compared to a substrate having an un-patterned interface modification layer (see FIG. 13), effectively preventing the uneven distribution of the organic semiconductor solution on the individual layer when the solution is applied to the substrate.

Figure 8:
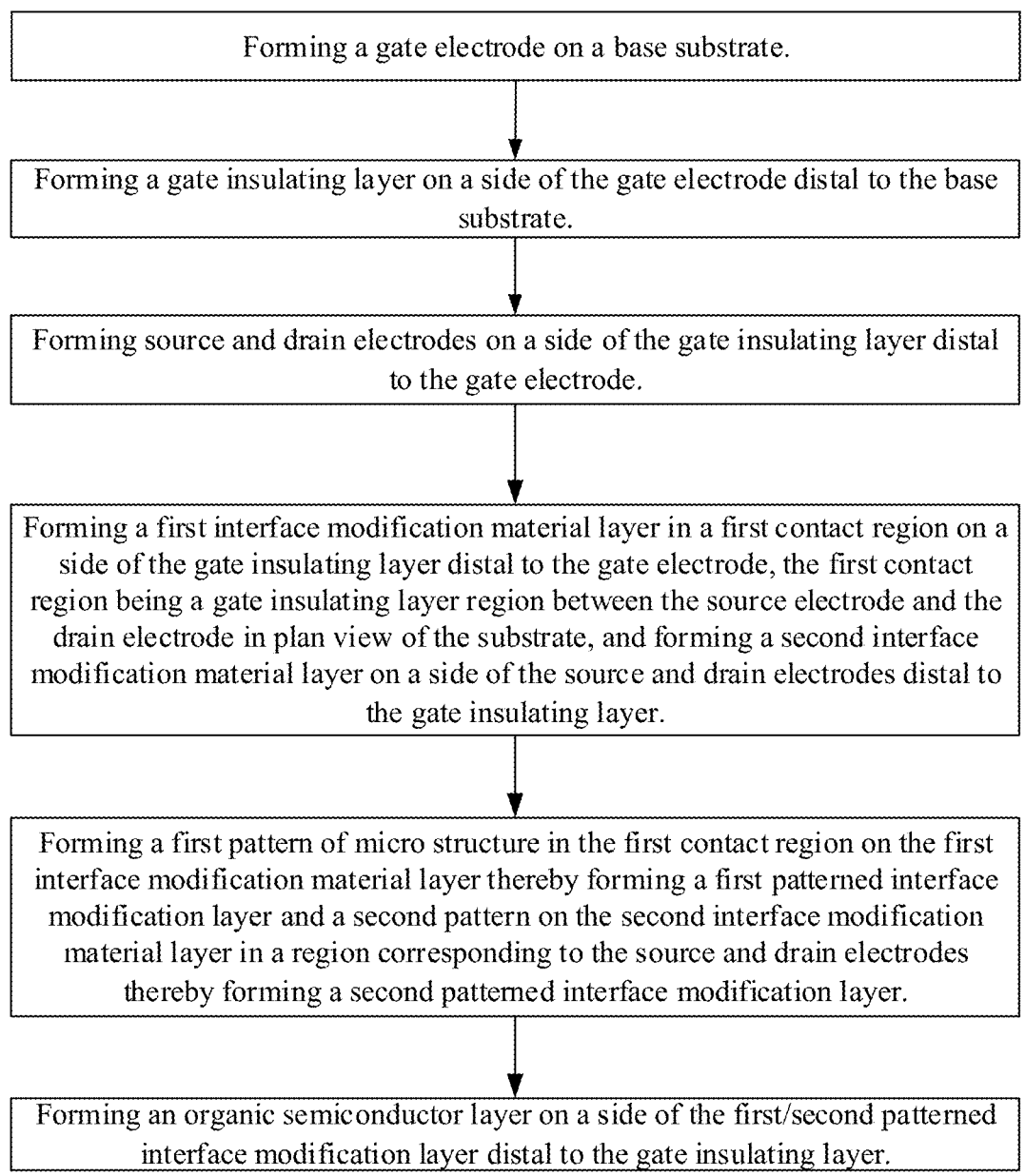
FIG. 8 is a flow chart illustrating a method of fabricating an organic thin film transistor in some embodiments.

FIG. 8 is a flow chart illustrating a method of fabricating an organic thin film transistor in some embodiments. Referring to FIG. 8, the method in the embodiment includes forming a gate electrode on a base substrate; forming a gate insulating layer on a side of the gate electrode distal to the base substrate; forming source and drain electrodes on a side of the gate insulating layer distal to the gate electrode; forming a first interface modification material layer in a first contact region on a side of the gate insulating layer distal to the gate electrode, the first contact region being a gate insulating layer region between the source electrode and the drain electrode in plan view of the substrate, and forming a second interface modification material layer on a side of the source and drain electrodes distal to the gate insulating layer; forming a first pattern of micro structure in the first contact region on the first interface modification material layer thereby forming a first patterned interface modification layer and a second pattern on the second interface modification material layer in a region corresponding to the source and drain electrodes thereby forming a second patterned interface modification layer; and forming an organic semiconductor layer on a side of the first/second patterned interface modification layer distal to the gate insulating layer.

With reference to the first three steps of the method illustrated in FIG. 8, the same basic processes and conditions as discussed in connection with the corresponding steps of FIG. 2 can be used. Various embodiments discussed therein may be practiced in connection with the first three steps of the method illustrated in FIG. 8 in an equivalent fashion.

With reference to the first interface modification material layer and the first patterned interface modification layer, the same basic processes and conditions as discussed in connection with the first interface modification material layer and the first patterned interface modification layer in FIG. 2 can be used. Various embodiments discussed therein may be practiced in connection with the first interface modification material layer and the first patterned interface modification layer in an equivalent fashion.

With reference to the second interface modification material layer and the second patterned interface modification layer, the same basic processes and conditions as discussed in connection with the second interface modification material layer and the second patterned interface modification layer in FIG. 5 can be used. Various embodiments discussed therein may be practiced in connection with the second interface modification material layer and the second patterned interface modification layer in an equivalent fashion.

Optionally, the first patterned interface modification layer and the second patterned interface modification layer are formed separately. Optionally, the first patterned interface modification layer and the second patterned interface modification layer are made of different materials. Optionally, the first patterned interface modification layer and the second patterned interface modification layer are made of a same material. Optionally, the first patterned interface modification layer and the second patterned interface modification layer are formed in a same process. For example, an interface modification material layer may be formed on the substrate having a gate electrode, a gate insulating layer, and source and drain electrodes. The interface modification material layer includes a first interface modification material layer in the first contact region on the gate insulating layer and a second interface modification material layer in the source and drain electrodes region.

Numerous embodiments may be practiced for forming the first pattern in the first interface modification material layer and the second pattern in the second interface modification material layer. For example, the first pattern and the second pattern may be formed by using a mask plate, thereby forming a first patterned interface modification layer with the first contact region and a second patterned interface modification layer in the region corresponding to the source and drain electrodes. The first pattern and the second pattern may be formed using two mask plates in two separate patterning processes. Alternatively, the first pattern and the second pattern may be formed using one single mask plate in a single patterning process. Various alternative embodiments may be practiced to form the first patterned interface modification layer and the second patterned interface modification layer.

In some embodiments, a first mask plate and a second mask plate are used for patterning the first pattern and the second pattern, respectively. Optionally, the method includes exposing (e.g., to ultraviolet radiation) the first interface modification material layer with a first mask plate; exposing (e.g., to ultraviolet radiation) the second interface modification material layer with a second mask plate; forming a first pattern on the first interface modification material layer in the first contact region; forming a second pattern on the second interface modification material layer in a region corresponding to the source and drain electrodes, thereby forming a first patterned interface modification layer on the gate insulating layer and a second patterned interface modification layer on the source and drain electrodes.

In some embodiments, a single mask plate (e.g., a third mask plate) are used for patterning the first pattern and the second pattern. Optionally, the method includes exposing (e.g., to ultraviolet radiation) the interface modification material layer with a third mask plate; forming a first pattern on the first interface modification material layer in the first contact region and a second pattern on the second interface modification material layer in a region corresponding to the source and drain electrodes, thereby forming a first patterned interface modification layer on the gate insulating layer and a second patterned interface modification layer on the source and drain electrodes.

Figure 9:
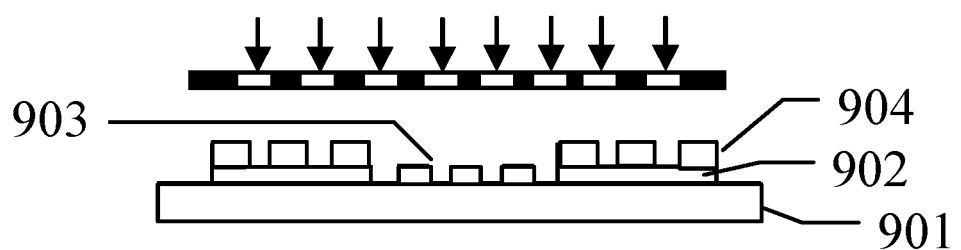
FIG. 9 is a diagram illustrating a process of patterning the first interface modification layer and the second interface modification layer in some embodiments.

FIG. 9 is a diagram illustrating a process of patterning the first interface modification layer and the second interface modification layer in some embodiments. Referring to FIG. 9, the organic thin film transistor in the embodiment includes a gate insulating layer 901, source and drain electrodes 902, a first patterned interface modification layer 903 in the first contact region, and a second patterned interface modification layer 904 in the region corresponding to the source and drain electrodes 902.

Any appropriate exposure device may be used. Examples of exposure devices include, but are not limited to, a contact exposure device, a projection exposure device, and a stepper exposure device. Optionally, the exposing step is performed in the presence of ozone. For example, an ozone-containing gas may be supplied into the UV exposure device during the exposing step.

Having ozone during the UV exposure process promotes a homogenous degradation of the first/second interface modification material layer. It also has surface cleansing and surface oxidation functions.

As discussed above, the method in the embodiment includes exposing the first interface modification material layer and the second interface modification material layer to an ultraviolet light with two mask plates (e.g., the first mask plate and the second mask plate) or a single mask plate (e.g., the third mask plate); and forming the first pattern and the second pattern on the interface modification material layer. Optionally, the method further includes exposing the interface modification material layer to an ultraviolet light in regions other than the first contact region and the source and drain electrodes region; and removing the interface modification material by ultraviolet radiation in the regions other than the first contact region and the source and drain electrodes region. Optionally, these exposing steps are performed in using different mask plates in two or more processes. Optionally, all exposing steps are performed in one single exposure step using one single mask plate.

The method in FIG. 8 includes a step of forming an organic semiconductor layer on a side of the first/second patterned interface modification layer distal to the gate insulating layer. For example, the organic thin film transistor in some embodiments includes an interface modification layer between the organic semiconductor layer and the source and drain electrodes, as well as between the organic semiconductor layer and the gate insulating layer in the first contact region.

Optionally, the organic semiconductor layer may be formed by coating an organic semiconductor material on the first patterned interface modification layer and on the second patterned interface modification layer.

Figure 10:
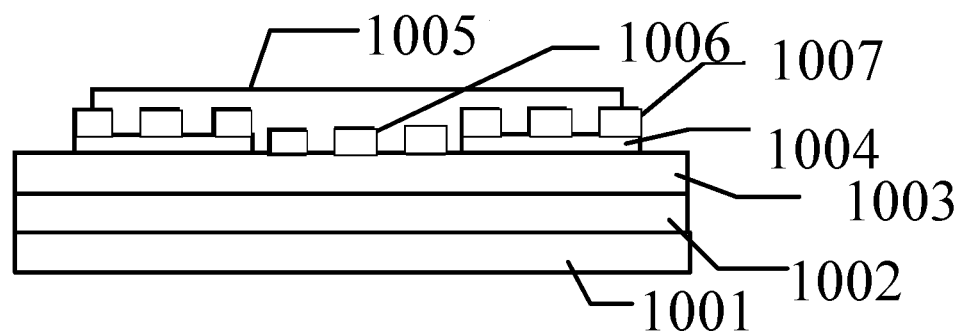
FIG. 10 is a diagram illustrating the structure of an organic thin film transistor in some embodiments.

FIG. 10 is a diagram illustrating the structure of an organic thin film transistor in some embodiments. Referring to FIG. 10, the organic thin film transistor is an organic thin film transistor fabricated by the method illustrated in FIG. 8. The organic thin film transistor in FIG. 10 is a bottom contact-type organic thin film transistor. Optionally, the organic thin film transistor may be a top contact-type organic thin film transistor in some embodiments.

In the present method, a first patterned interface modification layer is formed in the first contact region on the gate insulating layer, a second patterned interface modification layer is formed on a side of the source electrode and the drain electrode distal to the gate insulating layer in a second contact region, the second contact region being a region corresponding to the source electrode and the drain electrode. By forming a first patterned interface modification layer in the first contact region and forming a second patterned interface modification layer in the source and drain electrodes region, the substrate surface is modified to have a significantly smaller contact angle as compared to a substrate having an un-patterned interface modification layer (see FIG. 13), effectively preventing the uneven distribution of the organic semiconductor solution on the individual layer when the solution is applied to the substrate.

Figure 11:
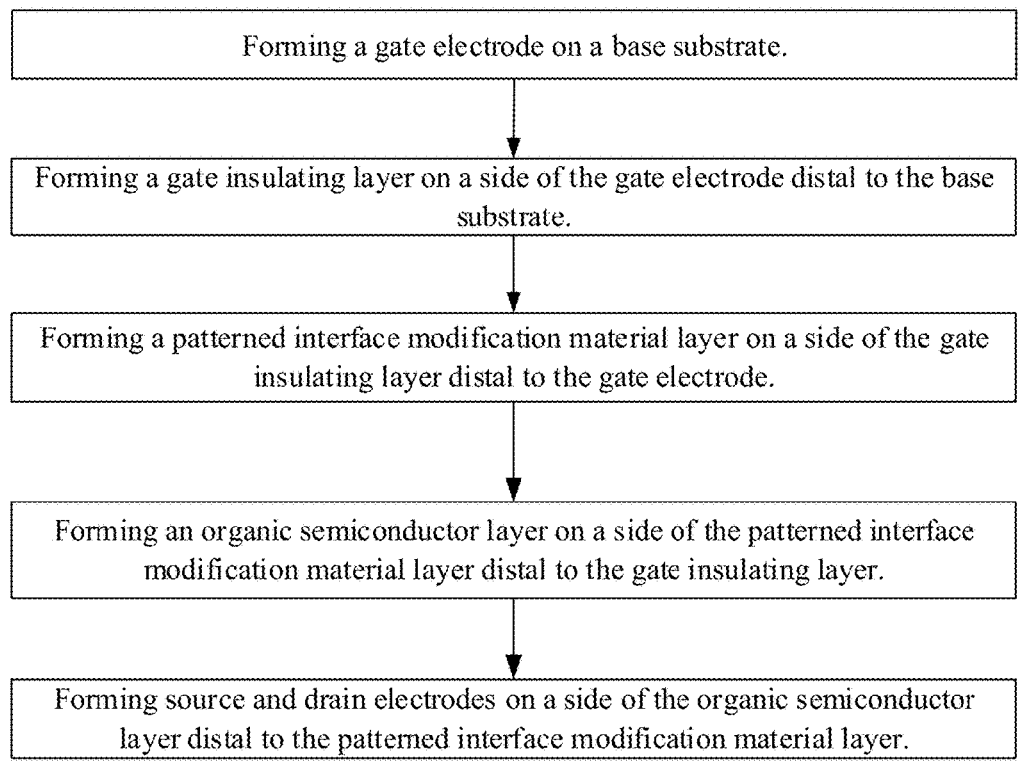
FIG. 11 is a flow chart illustrating a method of fabricating an organic thin film transistor in some embodiments.

FIG. 11 is a flow chart illustrating a method of fabricating an organic thin film transistor in some embodiments. Referring to FIG. 11, the method in the embodiment includes forming a gate electrode on a base substrate; forming a gate insulating layer on a side of the gate electrode distal to the base substrate; forming a patterned interface modification material layer on a side of the gate insulating layer distal to the gate electrode; forming an organic semiconductor layer on a side of the patterned interface modification material layer distal to the gate insulating layer; and forming source and drain electrodes on a side of the organic semiconductor layer distal to the patterned interface modification material layer. Optionally, the patterned interface modification layer has a pattern of micro structure.

With reference to the first two steps of the method illustrated in FIG. 11, the same basic processes and conditions as discussed in connection with the corresponding steps of FIG. 2 can be used. Various embodiments discussed therein may be practiced in connection with the first two steps of the method illustrated in FIG. 11 in an equivalent fashion.

In some embodiments, the step of forming a patterned interface modification material layer includes exposing the interface modification material layer to an ultraviolet light with a fourth mask plate; removing the interface modification material by ultraviolet radiation in an exposed area; forming a pattern on the interface modification material layer on the gate insulating layer; thereby forming a patterned interface modification layer on the gate insulating layer.

Optionally, the method further includes soaking the substrate in (or spinning coating the substrate with) a solution containing an interface modification material (e.g., OTS or HMDS) for a soaking duration; washing the substrate with ethanol; drying the substrate thereby forming the interface modification material layer.

Optionally, the OTS solution is a solution having 1 mM OTS in ethanol. Optionally, the HMDS solution is a solution having 1 mM HMDS in PGMEA. The soaking may be performed for a duration of about 1 hour, following by ethanol washing, and baking at 100 degree celsius for 10 minute.

Optionally, the method further includes exposing (e.g., to ultraviolet radiation) the interface modification material layer with a fourth mask plate; forming a third pattern on the interface modification material layer, thereby forming a patterned interface modification layer on the gate insulating layer.

Any appropriate exposure device may be used. Examples of exposure devices include, but are not limited to, a contact exposure device, a projection exposure device, and a stepper exposure device. Optionally, the exposing step is performed in the presence of ozone. For example, an ozone-containing gas may be supplied into the UV exposure device during the exposing step.

Having ozone during the UV exposure process promotes a homogenous degradation of the interface modification material layer. It also has surface cleansing and surface oxidation functions.

The method in FIG. 11 includes a step of forming an organic semiconductor layer on a side of the patterned interface modification layer distal to the gate insulating layer. The organic thin film transistor in some embodiments includes an interface modification layer between the organic semiconductor layer and the gate insulating layer throughout the entire area of the gate insulating layer.

Optionally, the organic semiconductor layer may be formed by coating an organic semiconductor material on the first patterned interface modification layer and on the second patterned interface modification layer.

With reference to forming the source and drain electrodes in the method illustrated in FIG. 11, the same basic processes and conditions as discussed in connection with the corresponding step of FIG. 2 can be used. Various embodiments discussed therein may be practiced in connection with the formation of the source and drain electrodes in FIG. 11 in an equivalent fashion.

Figure 12:
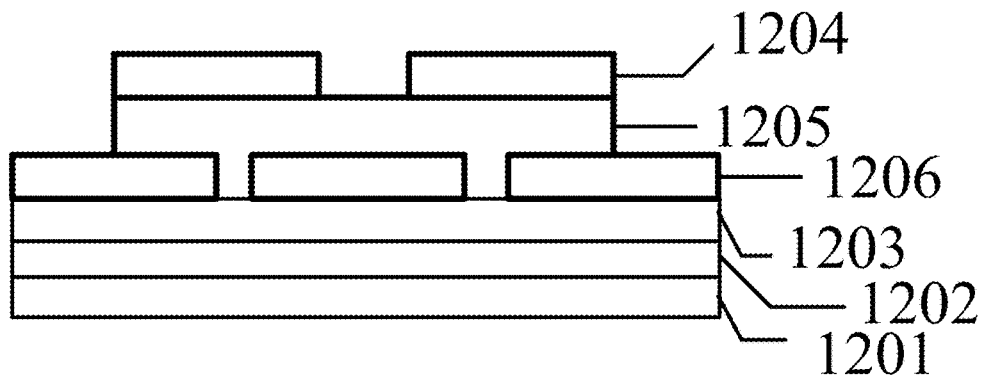
FIG. 12 is a diagram illustrating the structure of an organic thin film transistor in some embodiments.

FIG. 12 is a diagram illustrating the structure of an organic thin film transistor in some embodiments. Referring to FIG. 12, the organic thin film transistor is an organic thin film transistor fabricated by the method illustrated in FIG. 11. The organic thin film transistor in FIG. 12 is a bottom contact-type organic thin film transistor. Optionally, the organic thin film transistor may be a top contact-type organic thin film transistor in some embodiments.

In the present method, a patterned interface modification layer is formed in on a side of the gate insulating layer distal to the gate electrode. By forming a patterned interface modification layer on the gate insulating layer, the substrate surface is modified to have a significantly smaller contact angle as compared to a substrate having an un-patterned interface modification layer (see FIG. 13), effectively preventing the uneven distribution of the organic semiconductor solution on the individual layer when the solution is applied to the substrate.

In another aspect, the present disclosure provides an organic thin film transistor. In some embodiments, the organic thin film transistor includes a base substrate, an organic semiconductor layer, and a patterned interface modification layer on a side of the organic semiconductor layer proximal to the base substrate. Optionally, the substrate further includes a gate electrode on the base substrate, a gate insulating layer on a side of the gate electrode distal to the base substrate, and source and drain electrodes on a side of the gate insulating layer distal to the gate electrode.

The present organic thin film transistor has a patterned interface modification layer between the organic semiconductor layer and other layers of the organic thin film transistor. As discussed above, by forming a patterned interface modification layer on a layer in contact with the organic semiconductor, the surface of the contacting layer is modified to have a smaller contact angle. Thus, by including a patterned interface modification layer in the organic thin film transistor, a more evenly distributed organic semiconductor layer can be achieved, resulting in an organic thin film transistor having superior electronic properties.

In some embodiments, the organic thin film transistor includes a base substrate; a gate electrode on the base substrate; a gate insulating layer on a side of the gate electrode distal to the base substrate; source and drain electrodes on a side of the gate insulating layer distal to the gate electrode; a first patterned interface modification layer on a side of gate insulating layer distal to the gate electrode in a gate insulating layer region between the source electrode and the drain electrode in plan view of the substrate, and/or a second patterned interface modification layer on a side of the source and drain electrodes distal to the gate insulating layer in a region corresponding to the source and drain electrodes; and an organic semiconductor layer on a side of the interface modification layer distal to the base substrate.

In some embodiments, the organic thin film transistor includes a base substrate; a gate electrode on the base substrate; a gate insulating layer on a side of the gate electrode distal to the base substrate; a patterned interface modification layer on a side of the gate insulating layer distal to the gate electrode; an organic semiconductor layer on a side of the patterned interface modification layer distal to the gate insulating layer; and source and drain electrodes on a side of the organic semiconductor layer distal to the patterned interface modification layer.

Optionally, any of the above patterned interface modification layer has a pattern. Optionally, the pattern includes an array of interface modification blocks, rods, or objects of a certain shape and dimension.

Optionally, the block or rod has a length and a width in the range of about 0.1 μm to about 1 μm.

Optionally, the interface modification material is a photosensitive organic molecule. Optionally, the photosensitive organic molecule is a small molecule. Optionally, the photosensitive organic molecule is a polymer.

FIG. 4 is a diagram illustrating the structure of an organic thin film transistor in some embodiments. Referring to FIG. 4, the organic thin film transistor in the embodiment includes a base substrate 401; a gate electrode 402 on the base substrate 401; a gate insulating layer 403 on a side of the gate electrode 402 distal to the base substrate 401; source and drain electrodes 404 on a side of the gate insulating layer 403 distal to the gate electrode 402; a first patterned interface modification layer on a side of gate insulating layer 403 distal to the gate electrode 402 in a gate insulating layer region between the source electrode and the drain electrode in plan view of the substrate; and an organic semiconductor layer 405 on a side of the first interface modification layer and the source and drain electrodes 404 distal to the base substrate 401. The first patterned interface modification layer in the embodiment has a pattern 406.

Optionally, the gate electrode 402 is made of a conductive metal, a conductive metal oxide, or a conductive polymer. Examples of appropriate gate electrode materials include, but are not limited to, aluminum, molybdenum, copper, silver, and indium tin oxide. Optionally, the gate electrode 402 has a thickness in the range of about 20 nm to about 200 nm.

Optionally, the gate insulating layer 403 is made of a metal oxide, a metal nitride, or an organic insulating material. Examples of appropriate gate insulating layer materials include, but are not limited to, $SiO_x$ and $SiN_x$. Optionally, the gate insulating layer 403 has a thickness in the range of about 30 nm to about 500 nm.

Optionally, the source and drain electrodes 404 is made of a conductive metal or a conductive metal oxide. Examples of appropriate source and drain electrode materials include, but are not limited to, molybdenum, aluminum, copper, neodymium, silver, gold, and indium tin oxide. Optionally, the source and drain electrodes 404 has a thickness in the range of about 20 nm to about 200 nm.

Optionally, the organic semiconductor layer 405 is made of an organic molecule. Optionally, the organic molecule is a small molecule. Optionally, the organic molecule is a polymer. Optionally, the organic semiconductor layer 405 is made of a self-assembled small molecule. Optionally, the organic semiconductor layer 405 has a thickness in the range of about 10 nm to about 200 nm.

Optionally, the first patterned interface modification layer has a first pattern. Optionally, the first pattern includes an array of interface modification blocks, rods, or objects of a certain shape and dimension. Optionally, the block or rod has a length and a width in the range of about 50 nm to about 10000 nm. Optionally, the block or rod has a length and a width in the range of about 0.1 µm to about 1 µm.

Optionally, the interface modification material is a material suitable for printing or spin coating. Optionally, the interface modification material is a photosensitive organic molecule. Optionally, the photosensitive organic molecule is a small molecule. Optionally, the photosensitive organic molecule is a polymer. Examples of interface modification materials include, but are not limited to, hydroxyl compound, HMDS, and OTS.

The present organic thin film transistor has a first patterned interface modification layer on a side of gate insulating layer distal to the gate electrode in a first contact region, the first contact region being a gate insulating layer region between a source electrode and a drain electrode in plan view of the substrate. As discussed above, by forming a patterned interface modification layer on a layer in contact with the organic semiconductor, the surface of the contacting layer is modified to have a smaller contact angle. Thus, by including a first patterned interface modification layer in the organic thin film transistor, a more evenly distributed organic semiconductor layer can be achieved, resulting in an organic thin film transistor having superior electronic properties.

FIG. 7 is a diagram illustrating the structure of an organic thin film transistor in some embodiments. Referring to FIG. 7, the organic thin film transistor in the embodiment includes a base substrate 701; a gate electrode 702 on the base substrate 701; a gate insulating layer 703 on a side of the gate electrode 702 distal to the base substrate 701; source and drain electrodes 704 on a side of the gate insulating layer 703 distal to the gate electrode 702; a second patterned interface modification layer on a side of the source and drain electrodes 704 distal to the gate insulating layer 703 in a region corresponding to the source and drain electrodes; and an organic semiconductor layer 705 on a side of the second interface modification layer distal to the base substrate 701. The second patterned interface modification layer in the embodiment has a pattern 706.

With reference to the gate electrode 702, the gate insulating layer 703, the source and drain electrodes 704, and the organic semiconductor layer 705, the same materials and dimensions as discussed in connection with the corresponding components in FIG. 2 can be used. Various embodiments discussed therein may be practiced in connection with the gate electrode 702, the gate insulating layer 703, and the source and drain electrodes 704 in an equivalent fashion.

Optionally, the second patterned interface modification layer has a second pattern. Optionally, the second pattern includes an array of interface modification blocks, rods, or objects of a certain shape and dimension. Optionally, the block or rod has a length and a width in the range of about 50 nm to about 10000 nm. Optionally, the block or rod has a length and a width in the range of about 0.1 µm to about 1 µm.

Optionally, the interface modification material is a material suitable for printing or spin coating. Optionally, the interface modification material is a photosensitive organic molecule. Optionally, the photosensitive organic molecule is a small molecule. Optionally, the photosensitive organic molecule is a polymer. Examples of interface modification materials include, but are not limited to, hydroxyl compound, HMDS, and OTS.

The present organic thin film transistor has a second patterned interface modification layer on a side of source and drain electrodes distal to the gate insulating layer in a second contact region, the second contact region being a region corresponding to the source electrode and the drain electrode. As discussed above, by forming a patterned interface modification layer on a layer in contact with the organic semiconductor, the surface of the contacting layer is modified to have a smaller contact angle. Thus, by including a second patterned interface modification layer in the organic thin film transistor, a more evenly distributed organic semiconductor layer can be achieved, resulting in an organic thin film transistor having superior electronic properties.

FIG. 10 is a diagram illustrating the structure of an organic thin film transistor in some embodiments. Referring to FIG. 10, the organic thin film transistor in the embodiment includes a base substrate 1001; a gate electrode 1002 on the base substrate 1001; a gate insulating layer 1003 on a side of the gate electrode 1002 distal to the base substrate 1001; source and drain electrodes 1004 on a side of the gate insulating layer 1003 distal to the gate electrode 1002; a first patterned interface modification layer on a side of gate insulating layer 1003 distal to the gate electrode 1002 in a gate insulating layer region between the source electrode and the drain electrode in plan view of the substrate; a second patterned interface modification layer on a side of source and drain electrodes 1004 distal to the gate insulating layer 1003 in a region corresponding to the source and drain electrodes; and an organic semiconductor layer 1005 on a side of the first/second interface modification layer distal to the base substrate 1001. The first patterned interface modification layer in the embodiment has a pattern 1006. The second patterned interface modification layer in the embodiment has a pattern 1007.

With reference to the gate electrode 1002, the gate insulating layer 1003, the source and drain electrodes 1004, and the organic semiconductor layer 1005, the same materials and dimensions as discussed in connection with the corresponding components in FIG. 4 can be used. Various embodiments discussed therein may be practiced in connection with the gate electrode 1002, the gate insulating layer 1003, the source and drain electrodes 1004, and the organic semiconductor layer 1005 in an equivalent fashion.

Optionally, the first patterned interface modification layer has a first pattern. Optionally, the first pattern includes an array of interface modification blocks, rods, or objects of a certain shape and dimension. Optionally, the second patterned interface modification layer has a second pattern. Optionally, the second pattern includes an array of interface modification blocks, rods, or objects of a certain shape and dimension. Optionally, the block or rod has a length and a width in the range of about 50 nm to about 10000 nm. Optionally, the block or rod has a length and a width in the range of about 0.1 µm to about 1 µm.

Optionally, the interface modification material is a material suitable for printing or spin coating. Optionally, the interface modification material is a photosensitive organic molecule. Optionally, the photosensitive organic molecule is a small molecule. Optionally, the photosensitive organic molecule is a polymer. Examples of interface modification materials include, but are not limited to, hydroxyl compound, HMDS, and OTS.

The present organic thin film transistor has a first patterned interface modification layer and a second patterned interface modification layer. As discussed above, by forming a patterned interface modification layer on a layer in contact with the organic semiconductor, the surface of the contacting layer is modified to have a smaller contact angle. Thus, by including a first/second patterned interface modification layer in the organic thin film transistor, a more evenly distributed organic semiconductor layer can be achieved, resulting in an organic thin film transistor having superior electronic properties.

FIG. 12 is a diagram illustrating the structure of an organic thin film transistor in some embodiments. Referring to FIG. 12, the organic thin film transistor in the embodiment includes a base substrate 1201; a gate electrode 1202 on the base substrate 1201; a gate insulating layer 1203 on a side of the gate electrode 1202 distal to the base substrate 1201; a patterned interface modification layer 1206 on a side of the gate insulating layer 1203 distal to the gate electrode 1202; an organic semiconductor layer 1205 on a side of the patterned interface modification material layer 1206 distal to the gate insulating layer 1203; and source and drain electrodes 1204 on a side of the organic semiconductor layer 1205 distal to the patterned interface modification material layer 1206.

With reference to the gate electrode 1202, the gate insulating layer 1203, the source and drain electrodes 1204, and the organic semiconductor layer 1205, the same materials and dimensions as discussed in connection with the corresponding components in FIG. 4 can be used. Various embodiments discussed therein may be practiced in connection with the gate electrode 1202, the gate insulating layer 1203, the source and drain electrodes 1204, and the organic semiconductor layer 1205 in an equivalent fashion.

Optionally, the patterned interface modification layer has a pattern. Optionally, the pattern includes an array of interface modification blocks, rods, or objects of a certain shape and dimension. Optionally, the block or rod has a length and a width in the range of about 50 nm to about 10000 nm. Optionally, the block or rod has a length and a width in the range of about 0.1 μm to about 1 μm.

Optionally, the interface modification material is a material suitable for printing or spin coating. Optionally, the interface modification material is a photosensitive organic molecule. Optionally, the photosensitive organic molecule is a small molecule. Optionally, the photosensitive organic molecule is a polymer. Examples of interface modification materials include, but are not limited to, hydroxyl compound, HMDS, and OTS.

The present organic thin film transistor has a patterned interface modification layer on a side of the gate insulating layer distal to the gate electrode. As discussed above, by forming a patterned interface modification layer on a layer in contact with the organic semiconductor, the surface of the contacting layer is modified to have a smaller contact angle. Thus, by including a patterned interface modification layer in the organic thin film transistor, a more evenly distributed organic semiconductor layer can be achieved, resulting in an organic thin film transistor having superior electronic properties.

In another aspect, the present disclosure further provides a display substrate having an organic thin film transistor described herein or fabricated by a method described herein.

In another aspect, the present disclosure further provides a display apparatus having a display substrate described herein. Examples of display apparatus include, but are not limited to, an electronic paper, a mobile phone, a tablet computer, a television, a monitor, a notebook computer, a desktop computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating an organic thin film transistor, comprising:
    providing a substrate;
    forming an interface modification material layer on the substrate;
    selecting a target region in the interface modification material layer;
    decreasing a contact angle of the interface modification material layer in the target region with respect to an organic semiconductor material, by patterning the interface modification material layer in the target region to form a plurality of micro structures spaced apart from each other by a plurality of regions, thereby forming a patterned interface modification layer in the target region; and
    forming an organic semiconductor layer on a side of the patterned interface modification layer in the target region distal to the substrate;
    wherein,
    in the plurality of regions, an interface modification material is absent on a surface of one or more layers partially abutting the patterned interface modification layer and on a side of the patterned interface modification layer proximal to the base substrate;
    the organic semiconductor layer is formed to be in contact with the one or more layers in the plurality of regions in which the interface modification material is absent;
    each of the plurality of micro structures is formed to have at least one dimension smaller than a width of a source electrode of the organic thin film transistor; and
    each of the plurality of regions is formed to have at least one dimension smaller than a width of a source electrode of the organic thin film transistor.

2. The method of claim 1, wherein the plurality of micro structures in the target region is formed to comprise one of: a plurality of first micro structures spaced apart from each other by multiple first regions, and on a side of a gate insulating layer distal to a gate electrode in a first contact region, the first contact region being a gate insulating layer region between a source electrode and a drain electrode in plan view of the substrate; and a plurality of second micro structures spaced apart from each other by multiple second regions, and on a side of the source electrode and the drain electrode distal to the gate insulating layer in a second contact region, the second contact region being a region corresponding to the source electrode and the drain electrode;

wherein, when the plurality of micro structures in the target region are formed to comprise the plurality of first micro structures spaced apart from each other by the multiple first regions, the interface modification material is absent in the multiple first regions on a surface of the gate insulating layer in the first contact region; and the organic semiconductor layer is formed to be in contact with the gate insulating layer in the multiple first regions;

wherein, when the plurality of micro structures in the target region are formed to comprise the plurality of second micro structures spaced apart from each other by the multiple second regions, the interface modification material is absent in the multiple second regions on a surface of the source electrode and the drain electrode in the second contact region; and the organic semiconductor layer is formed to be in contact with the source electrode and the drain electrode in the multiple second regions.

3. The method of claim 2, wherein forming the plurality of first micro structures comprises: forming a first interface modification material layer by applying a solution containing a first interface modification material to a surface of the substrate; washing the substrate with ethanol; and drying the substrate; exposing the first interface modification material layer to an ultraviolet light with a first mask plate; removing the first interface modification material in exposed areas by ultraviolet radiation; exposing the first interface modification material layer to an ultraviolet light in regions other than the first contact region, and removing the first interface modification material by ultraviolet radiation in the regions other than the first contact region.

4. The method of claim 2, wherein forming the plurality of second micro structures comprises: forming a second interface modification material layer by applying a solution containing a second interface modification material to a surface of the substrate; washing the substrate with ethanol; and drying the substrate; exposing the second interface modification material layer to an ultraviolet light with a second mask plate; removing the second interface modification material in exposed areas by ultraviolet radiation; exposing the second interface modification material layer to an ultraviolet light in regions other than the second contact region, and removing the second interface modification material by ultraviolet radiation in the regions other than the second contact region.

5. The method of claim 1, wherein the plurality of micro structures in the target region is formed to comprise both of: a plurality of first micro structures spaced apart from each other by multiple first regions, and on a side of a gate insulating layer distal to a gate electrode in a first contact region, the first contact region being a gate insulating layer region between a source electrode and a drain electrode in plan view of the substrate; and a plurality of second micro structures spaced apart from each other by multiple second regions, and on a side of the source electrode and the drain electrode distal to the gate insulating layer in a second contact region, the second contact region being a region corresponding to the source electrode and the drain electrode;

the plurality of micro structures in the target region are formed to comprise the plurality of first micro structures spaced apart from each other by the multiple first regions, and the plurality of second micro structures spaced apart from each other by the multiple second regions;

the interface modification material is absent in the multiple first regions on a surface of the gate insulating layer in the first contact region, and in the multiple second regions and on a surface of the source electrode and the drain electrode in the second contact region; and the organic semiconductor layer is formed to be in contact with the gate insulating layer in the multiple first regions, and to be in contact with the source electrode and the drain electrode in the multiple second regions.

6. The method of claim 5, wherein the plurality of first micro structures are formed using a first mask plate; and the plurality of second micro structures are formed using a second mask plate different from the first mask plate.

7. The method of claim 5, wherein the plurality of first micro structures and the plurality of second micro structures are formed using a third mask plate in a single process.

8. The method of claim 5, wherein forming the plurality of first micro structures comprises: forming a first interface modification material layer by applying a solution containing a first interface modification material to a surface of the substrate; washing the substrate with ethanol; and drying the substrate; exposing the first interface modification material layer to an ultraviolet light with a first mask plate; removing the first interface modification material in exposed areas by ultraviolet radiation; exposing the first interface modification material layer to an ultraviolet light in regions other than the first contact region, and removing the first interface modification material by ultraviolet radiation in the regions other than the first contact region.

9. The method of claim 5, wherein forming the plurality of second micro structures comprises: forming a second interface modification material layer by applying a solution containing a second interface modification material to a surface of the substrate; washing the substrate with ethanol; and drying the substrate; exposing the second interface modification material layer to an ultraviolet light with a second mask plate; removing the second interface modification material in exposed areas by ultraviolet radiation; exposing the second interface modification material layer to an ultraviolet light in regions other than the second contact region, and removing the second interface modification material by ultraviolet radiation in the regions other than the second contact region.

10. The method of claim 1, wherein the substrate comprises a base substrate; a gate electrode on the base substrate; and a gate insulating layer on a side of the gate electrode distal to the base substrate;

patterning the interface modification material layer in the target region comprises forming the plurality of micro structures spaced apart from each other by the plurality of regions on a side of gate insulating layer distal to the gate electrode;

forming the organic semiconductor layer comprises forming the organic semiconductor layer on a side of the plurality of micro structures distal to the gate insulating layer; and subsequent to forming the organic semiconductor layer, the method further comprising forming a source electrode and a drain electrode on a side of the organic semiconductor layer distal to the plurality of micro structures;

in the plurality of regions, the interface modification material is absent on a surface of the gate insulating layer; and the organic semiconductor layer is formed to be in contact with the gate insulating layer in the plurality of regions in which the interface modification material is absent.

11. The method of claim 10, wherein forming the interface modification material layer comprises applying a solution containing an interface modification material to a surface of the substrate; washing the substrate with ethanol; drying the substrate, thereby forming the interface modification material layer; and wherein patterning the interface modification material layer in the target region comprises exposing the interface modification material layer in the target region to an ultraviolet light with a mask plate; removing interface modification material in exposed areas by ultraviolet radiation thereby forming the plurality of micro structures.

12. The method of claim 1, wherein patterning the interface modification material layer in the target region comprises exposing the interface modification material layer to an ultraviolet light in the presence of ozone with a mask plate.

13. An organic thin film transistor, comprising:
a base substrate;
an organic semiconductor layer; and
a patterned interface modification layer on a side of the organic semiconductor layer proximal to the base substrate and in a target region;
wherein the patterned interface modification layer in the target region comprises a plurality of micro structures spaced apart from each other by a plurality of regions;
the patterned interface modification layer has a decreased contact angle with respect to an organic semiconductor material as compared to an unpatterned interface modification layer;
in the plurality of regions, an interface modification material is absent on a surface of one or more layers partially abutting the patterned interface modification layer and on a side of the patterned interface modification layer proximal to the base substrate;
the organic semiconductor layer is in contact with the one or more layers in the plurality of regions in which the interface modification material is absent;
each of the plurality of micro structures has at least one dimension smaller than a width of a source electrode of the organic thin film transistor; and
each of the plurality of regions has at least one dimension smaller than a width of a source electrode of the organic thin film transistor.

14. The organic thin film transistor of claim 13, further comprising a gate electrode on the base substrate, a gate insulating layer on a side of the gate electrode distal to the base substrate, and a source electrode and a drain electrode on a side of the gate insulating layer distal to the gate electrode;

wherein the patterned interface modification layer comprises one or both of a first patterned interface modification layer comprising a plurality of first micro structures spaced apart from each other by multiple first regions, and on a side of gate insulating layer distal to the gate electrode in a first contact region, the first contact region being a gate insulating layer region between the source electrode and the drain electrode in plan view of the substrate, and a second patterned interface modification layer comprising a plurality of second micro structures spaced apart from each other by multiple second regions, and on a side of the source electrode and the drain electrode distal to the gate insulating layer in a second contact region, the second contact region being a region corresponding to the source electrode and the drain electrode;

wherein, when the patterned interface modification layer comprises the first patterned interface modification layer, the interface modification material is absent in the multiple first regions on a surface of the gate insulating layer in the first contact region; and
the organic semiconductor layer is in contact with the gate insulating layer in the multiple first regions;

wherein, when the patterned interface modification layer comprises the second patterned interface modification layer, the interface modification material is absent in the multiple second regions on a surface of the source electrode and the drain electrode in the second contact region; and
the organic semiconductor layer is in contact with the source electrode and the drain electrode in the multiple second regions.

15. The organic thin film transistor of claim 13, wherein the plurality of micro structures comprises an array of interface modification blocks or rods; and
the plurality of regions in which the interface modification material is absent respectively space apart the interface modification blocks or rods.

16. The organic thin film transistor of claim 15, wherein the blocks or the rods has a length and a width in the range of about 0.1 µm to about 1 µm.

17. The organic thin film transistor of claim 13, wherein the patterned interface modification layer is made of a photosensitive organic molecule.

18. The organic thin film transistor of claim 13, further comprising a base substrate; a gate electrode on the base substrate; a gate insulating layer on a side of the gate electrode distal to the base substrate; and the source electrode and the drain electrode on a side of the organic semiconductor layer distal to the patterned interface modification layer;

wherein the patterned interface modification layer is on a side of the gate insulating layer distal to the gate electrode; and the organic semiconductor layer is on a side of the patterned interface modification layer distal to the gate insulating layer;

the interface modification material is absent in the plurality of regions on a surface of the gate insulating layer; and the organic semiconductor layer is in contact with the gate insulating layer in the plurality of regions in which the interface modification material is absent.

19. A display substrate comprising the organic thin film transistor of claim 13.

20. A display apparatus comprising the display substrate of claim 19.